(12) United States Patent
Patchell

(10) Patent No.: US 8,040,932 B2
(45) Date of Patent: Oct. 18, 2011

(54) SEMICONDUCTOR LASER AND METHOD OF MANUFACTURE

(76) Inventor: John A. Patchell, Dublin (IE)

( * ) Notice: Subject to any disclaimer, the term of this patent is extended or adjusted under 35 U.S.C. 154(b) by 101 days.

(21) Appl. No.: 11/991,261

(22) PCT Filed: Aug. 30, 2006

(86) PCT No.: PCT/EP2006/065831
§ 371 (c)(1), (2), (4) Date: Mar. 2, 2009

(87) PCT Pub. No.: WO2007/025992
PCT Pub. Date: Mar. 8, 2007

(65) Prior Publication Data
US 2009/0213887 A1    Aug. 27, 2009

(30) Foreign Application Priority Data
Aug. 31, 2005   (IE) .................................. S2005-0574

(51) Int. Cl.
*H01S 5/00* (2006.01)
(52) U.S. Cl. .................. 372/43.01; 372/46.01
(58) Field of Classification Search ............... 372/43.01
See application file for complete search history.

(56) References Cited

U.S. PATENT DOCUMENTS

| 4,309,668 A * | 1/1982 | Ueno et al. ............... 372/45.013 |
| 4,573,163 A | 2/1986 | Kaminow |
| 4,599,729 A | 7/1986 | Sasaki et al. |
| 4,608,697 A | 8/1986 | Coldren |
| 4,839,308 A | 6/1989 | Fye |
| 5,144,535 A | 9/1992 | Megens et al. |
| 5,612,968 A | 3/1997 | Zah |
| 5,684,816 A | 11/1997 | Takegi |
| 6,043,104 A * | 3/2000 | Uchida et al. .................. 438/32 |
| 6,252,894 B1 * | 6/2001 | Sasanuma et al. .......... 372/45.01 |
| 6,343,088 B1 | 1/2002 | Mugino et al. |
| 6,978,057 B1 * | 12/2005 | O'Gorman et al. ............. 385/14 |
| 7,672,348 B2 | 3/2010 | Patchell et al. |
| 2002/0064203 A1 | 5/2002 | Pezeshki et al. |
| 2002/0085604 A1 | 7/2002 | Sousa et al. |

(Continued)

FOREIGN PATENT DOCUMENTS

EP    0 631 354 A1    12/1994

(Continued)

OTHER PUBLICATIONS

Corbett, B., et al. "Single longitudinal mode ridge waveguide 1.3um Fabry-Perot laser by . . . ". Electronics Letters, vol. 31, No. 25, Dec. 7, 1995, pp. 2181-2182.

(Continued)

*Primary Examiner* — Jessica Stultz
*Assistant Examiner* — Xnning Niu
(74) *Attorney, Agent, or Firm* — Brooks, Cameron & Huebsch, PLLC

(57) ABSTRACT

The present application relates to a semiconductor laser, in particular such a laser which operates with substantially single longitudinal mode emission. The laser comprising a laser cavity, the laser further comprising a slot having an interface, characterized in that the slot is substantially filled with a reflective material having a large imaginary index relative to the laser cavity material. The interfaces of the slot may be inclined or may have a step for introducing a quarter wave phase shift.

20 Claims, 22 Drawing Sheets

U.S. PATENT DOCUMENTS

| | | |
|---|---|---|
| 2002/0131464 A1 | 9/2002 | Sirbu et al. |
| 2004/0136414 A1 | 7/2004 | Matsumoto et al. |
| 2004/0190580 A1 | 9/2004 | Pezeshki et al. |
| 2006/0088066 A1* | 4/2006 | He ................................ 372/10 |
| 2007/0189349 A1 | 8/2007 | Patchell et al. |
| 2008/0192781 A1 | 8/2008 | O'Gorman et al. |
| 2009/0268771 A1 | 10/2009 | Patchell et al. |

FOREIGN PATENT DOCUMENTS

| | | |
|---|---|---|
| JP | 10054917 | 2/1998 |
| WO | WO 01/22543 A1 | 3/2001 |

OTHER PUBLICATIONS

International Search Report, Dec. 14, 2006 (7 pgs).

* cited by examiner ered device to the laser cavity material.
SEMICONDUCTOR LASER AND METHOD OF MANUFACTURE This application is a National Stage application under 35 U.S.C. 371 of PCT/EP2006/065831, and published as WO 2007/025992 on Mar. 8, 2007, which claims priority to S2005/0574 filed Aug. 31, 2005.

FIELD

The present application relates to semiconductor lasers, in particular lasers that operate with substantially single longitudinal mode emission.

BACKGROUND

Achieving single mode emission by introducing perturbations at prescribed positions along the length of a device is known, see EP 1 214 763 (Trinity College Dublin) the contents of which are incorporated herein by reference. So called "slotted lasers", which achieve single longitudinal mode emission by means of optical feedback resulting from the etching of slot features along the laser cavity, are also disclosed in Irish Patent No S82521 (National University of Ireland, Cork) and S83622 (Eblana Photonics Ltd.) the contents of which are also incorporated herein by reference.

In general terms, the perturbations may be caused by any index altering means which modifies the refractive index profile of the waveguide to an appropriate degree to manipulate optical feedback and hence the spectral content of the device.

The term 'slot length' (designated $L_{slot}$ in the prior art drawing FIG. 1) as used herein refers to the distance between the longitudinal slot faces in the device material, ie 'slot length' is measured along the direction of light propagation, d. FIGS. 1 and 2 illustrate a typical prior art slotted laser 1 having a single rectangular slot 6. Typically such a device comprises waveguiding layers 2 (containing for example a multiple quantum well structure) covered by an upper cladding layer 4. Primary optical feedback means are provided in the form of a cleaved facet 8 at either end of the device. The distance between the facets and the effective index along the cavity determines the wavelength's of the Fabry Perot modes. The upper cladding layer 4 forms a ridge 3 having a cap layer 5. The slot features in such known devices are formed by etching a rectangular slot 6 in the ridge waveguide 3, resulting in two longitudinal interfaces 7 that are perpendicular to the direction of light propagation, d, within the device.

The mechanism whereby slotted lasers achieve their single mode performance has previously been described (e.g. Irish Patent Number S83622, the entire contents of which are incorporated herein by reference).

While the description of the present application which follows refers primarily to the case where the perturbations are defined by slots etched along the device it will be appreciated by a person skilled in the art that the teaching of the application is equally applicable to other forms of suitable perturbations.

The present application considers the scattering and reflection processes which occur in these devices. As discussed in greater detail below, the Applicants have realized that in prior art lasing devices scattering and reflection processes interfere destructively.

SUMMARY

There is a need for a lasing device where the scattering and reflection processes interfere constructively.

This need and others are addressed by a system in accordance with the invention which provides a laser which in accordance with the teaching of the inventions comprises a laser cavity, the laser further comprising a slot having an interface, characterised in that the slot is substantially filled with a reflective material having a large imaginary index relative to the laser cavity material.

The invention therefore provides a laser as claimed in claim 1. Advantageous embodiments are provided in the dependent claims thereto. The invention also provides a laser in accordance with claim 9, and the dependent claims thereto. The invention further provides a method of manufacturing a laser as claimed in claim 12 with advantageous embodiments provided in the claims dependent thereto.

DESCRIPTION OF DRAWINGS

The present invention will now be described with reference to the accompanying drawings in which.

Figure 11:
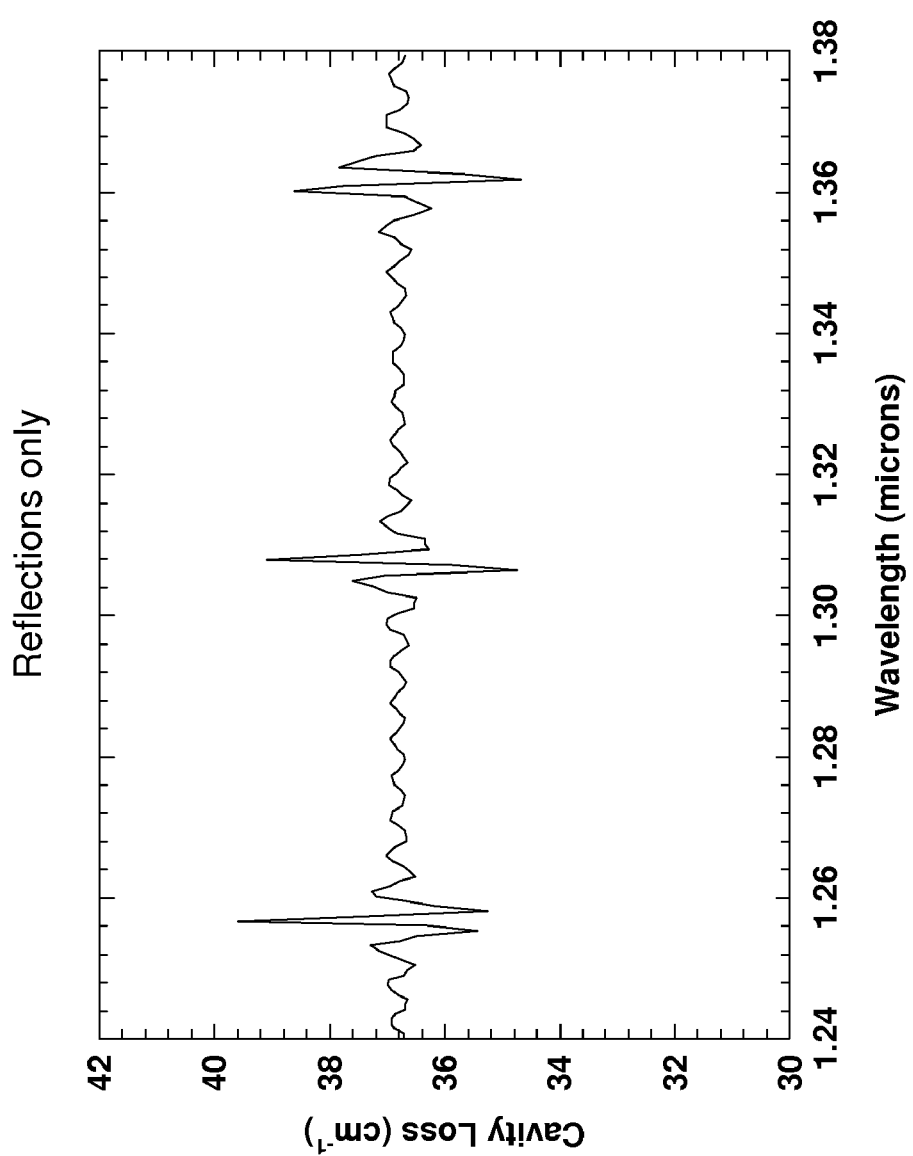
Figure 12:
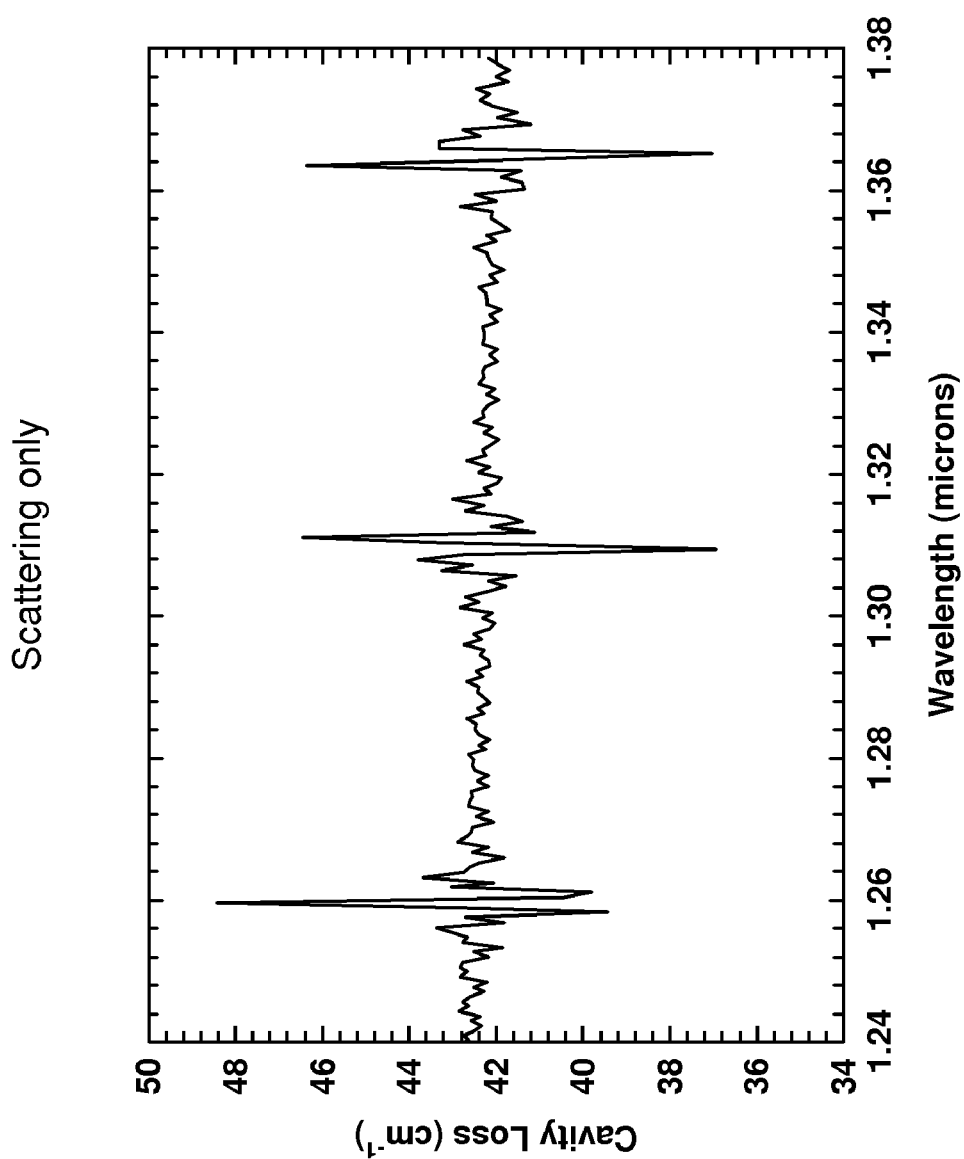
Figure 13:
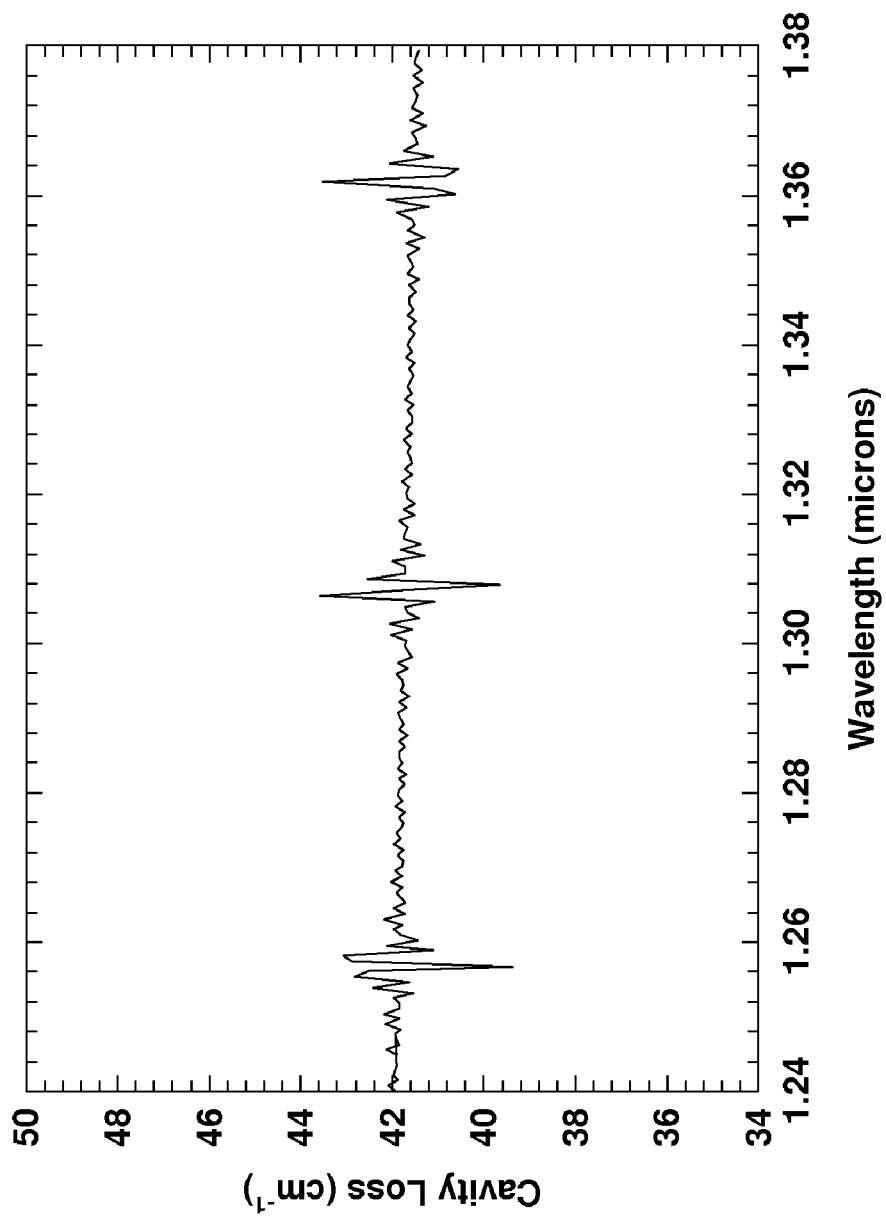
Figure 14:
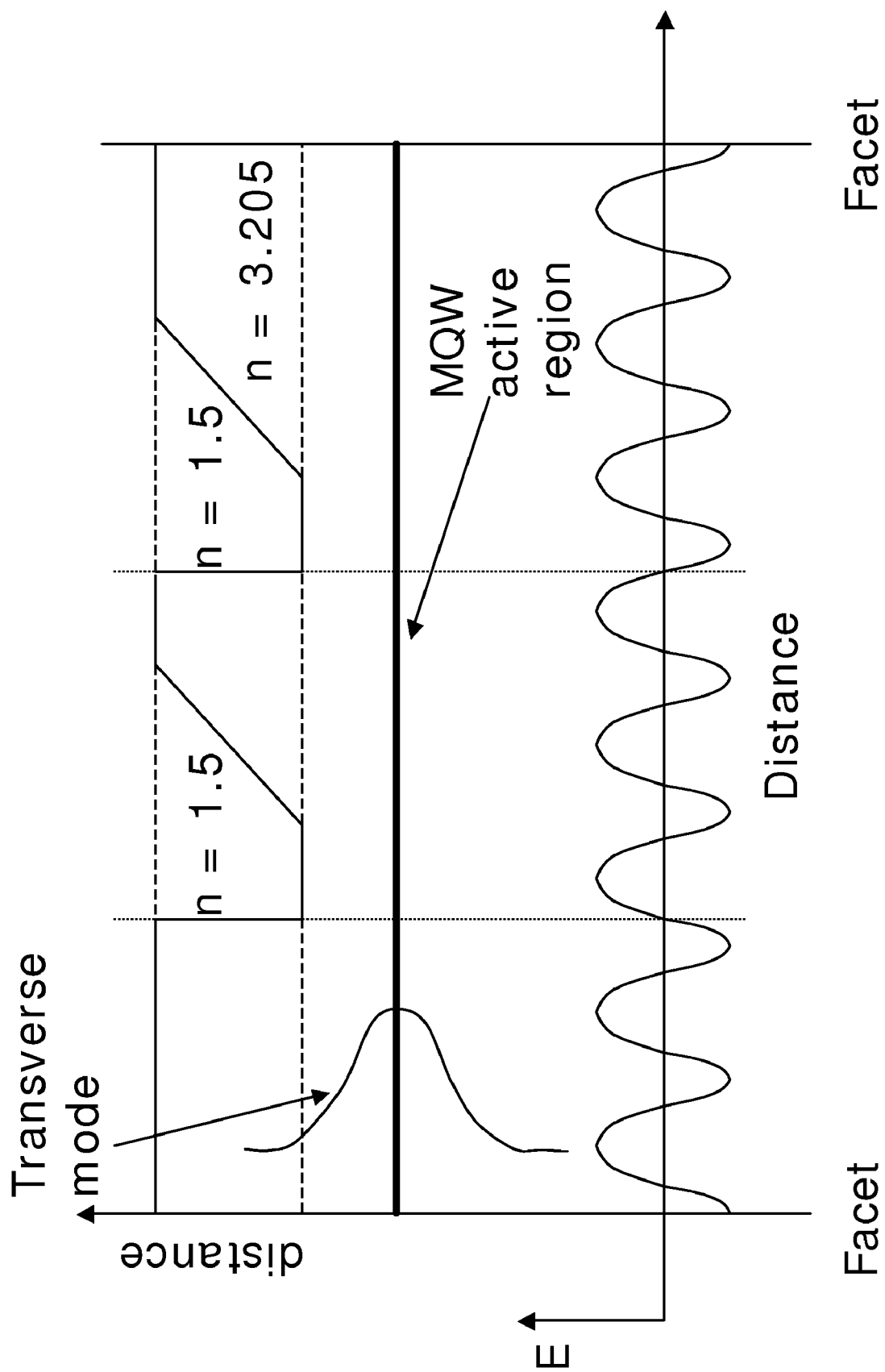
Figure 15:
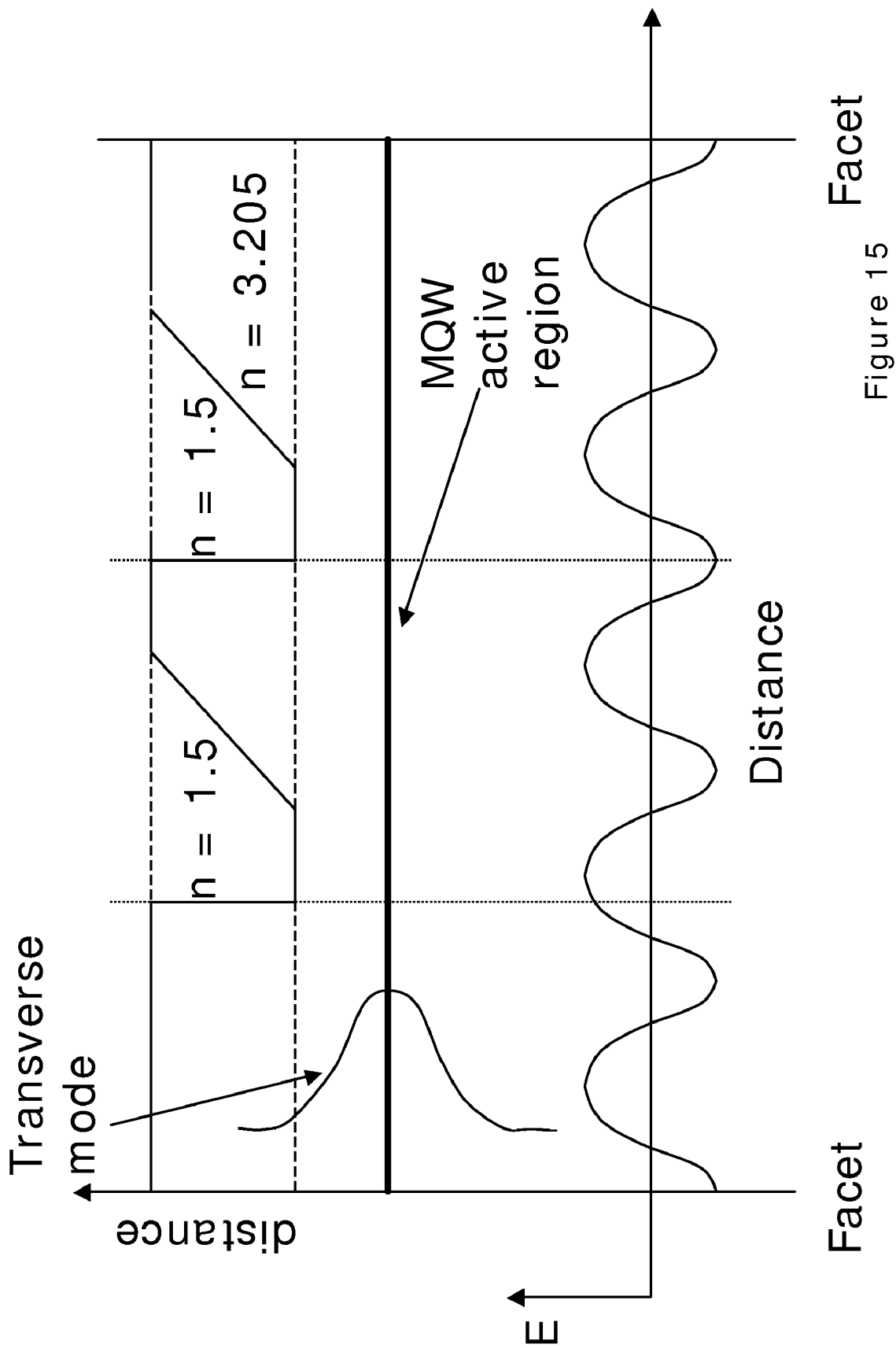
Figure 16:
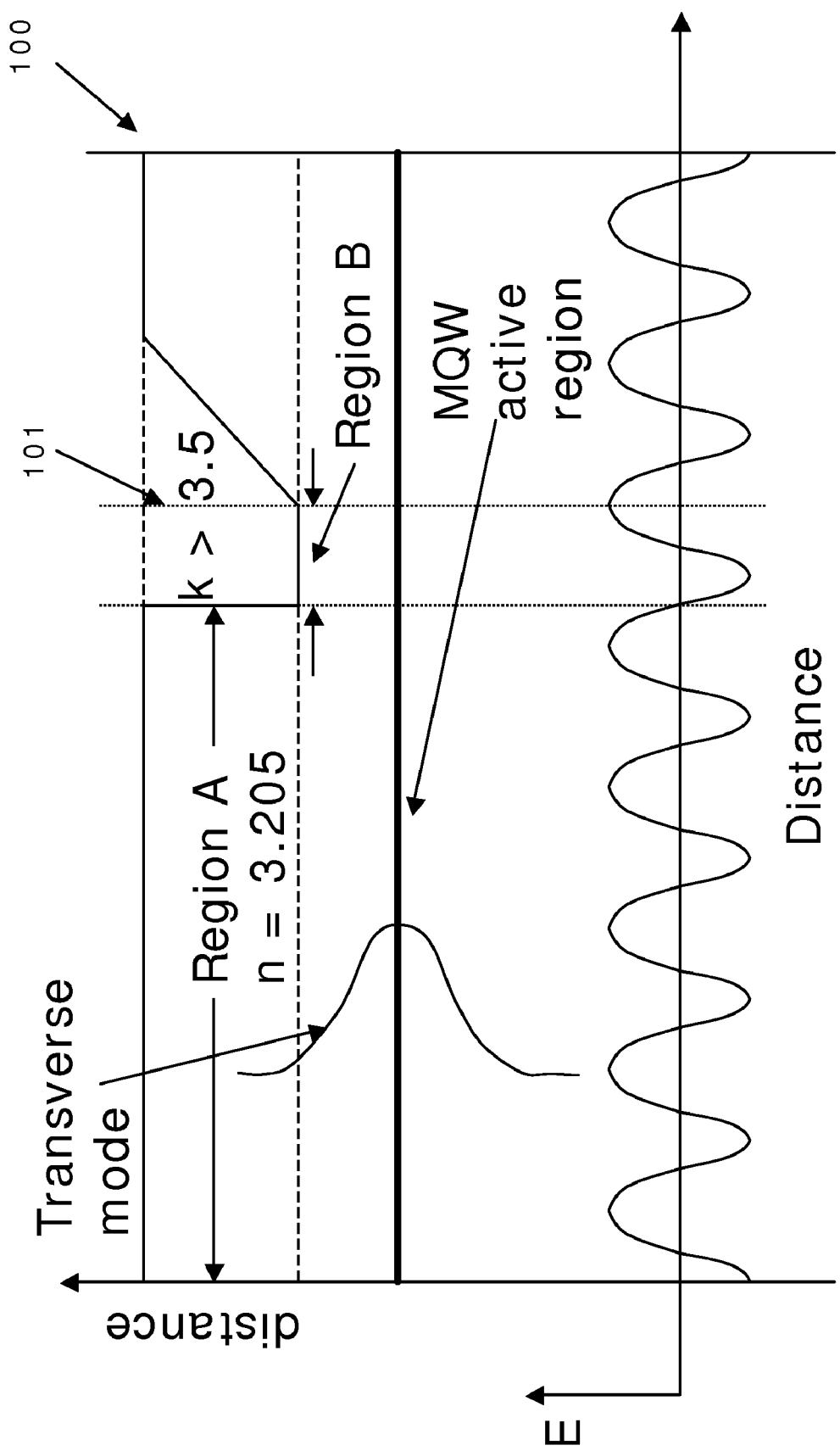
Figure 17:
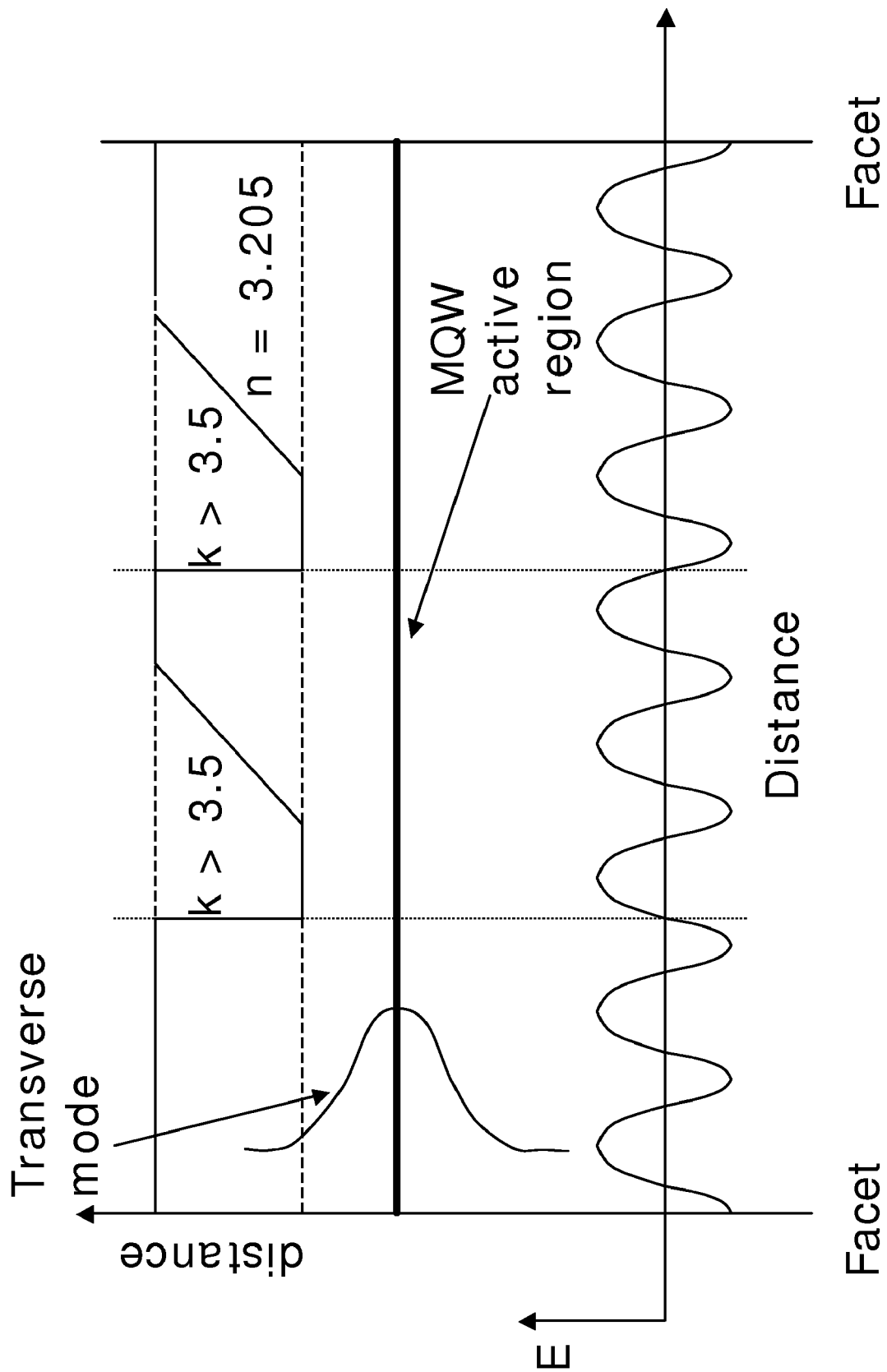
Figure 18:
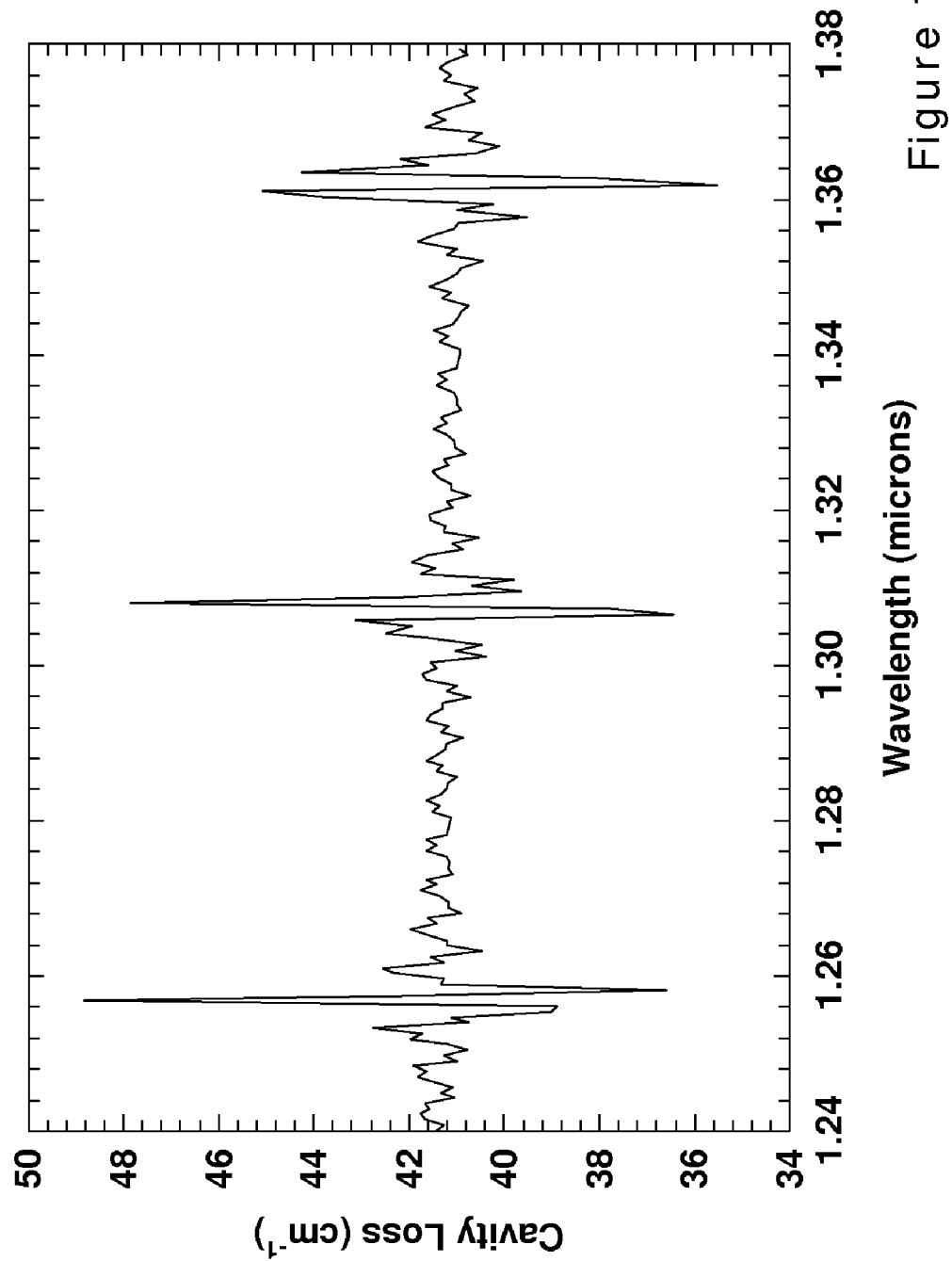
Figure 19:
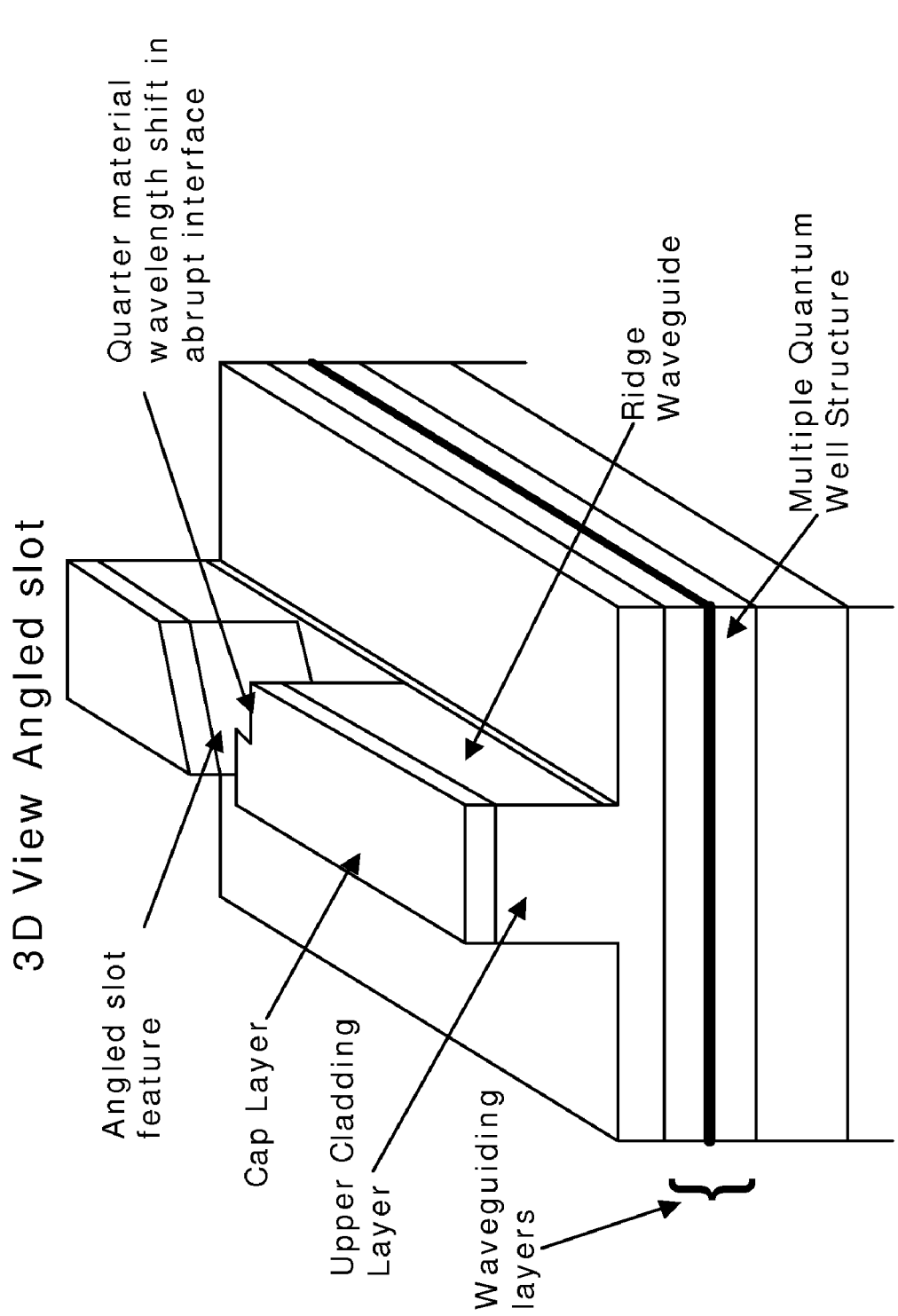
Figure 20:
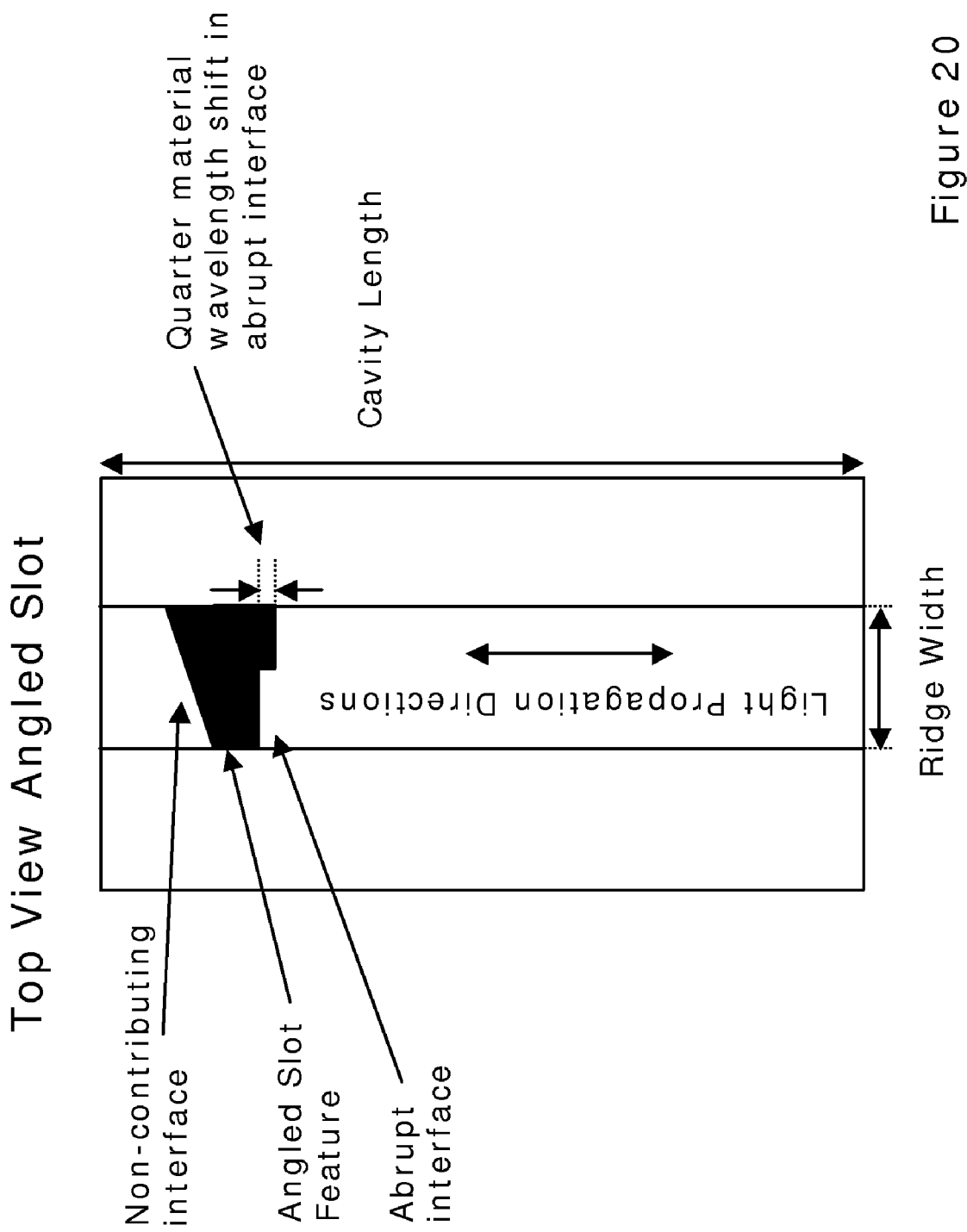
Figure 21:
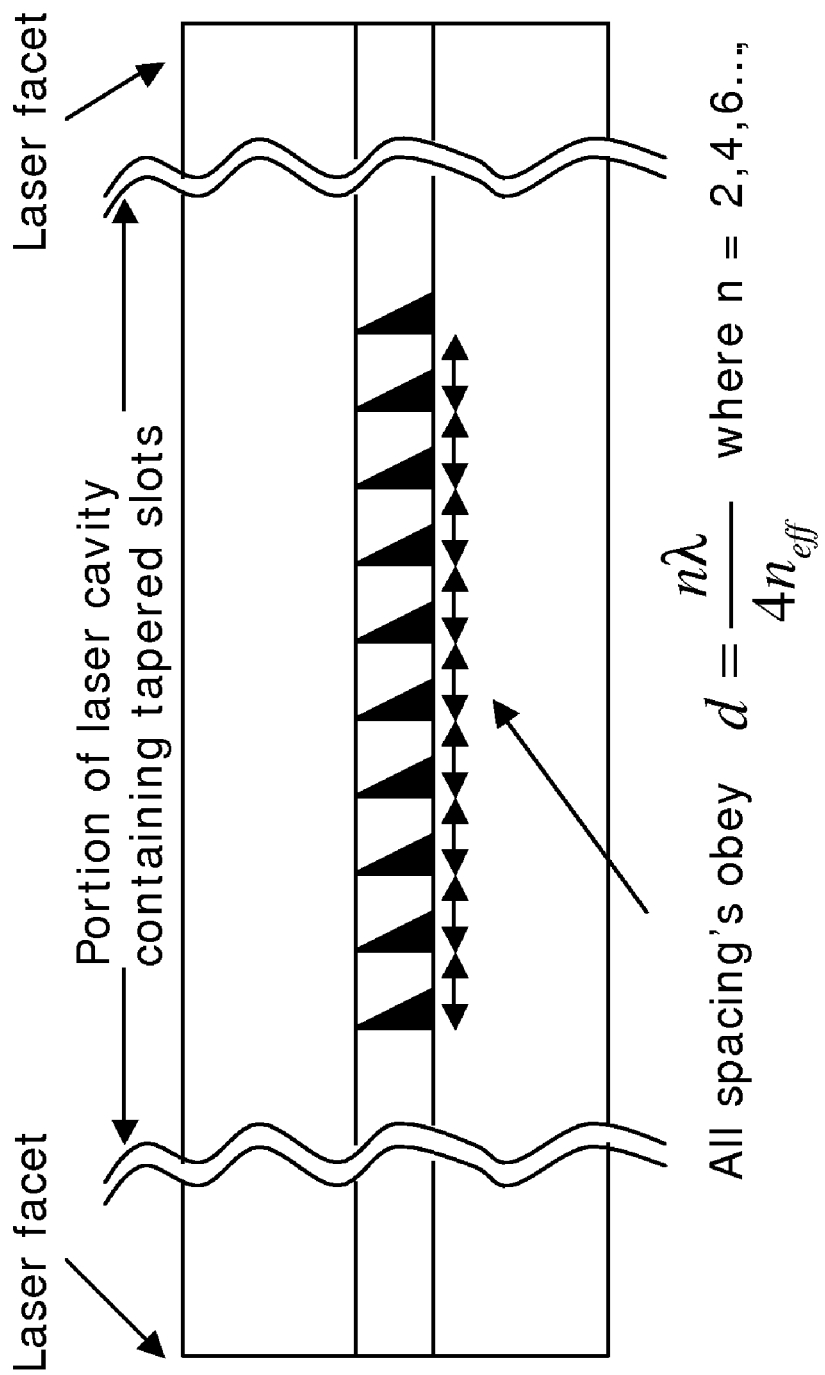
Figure 22:
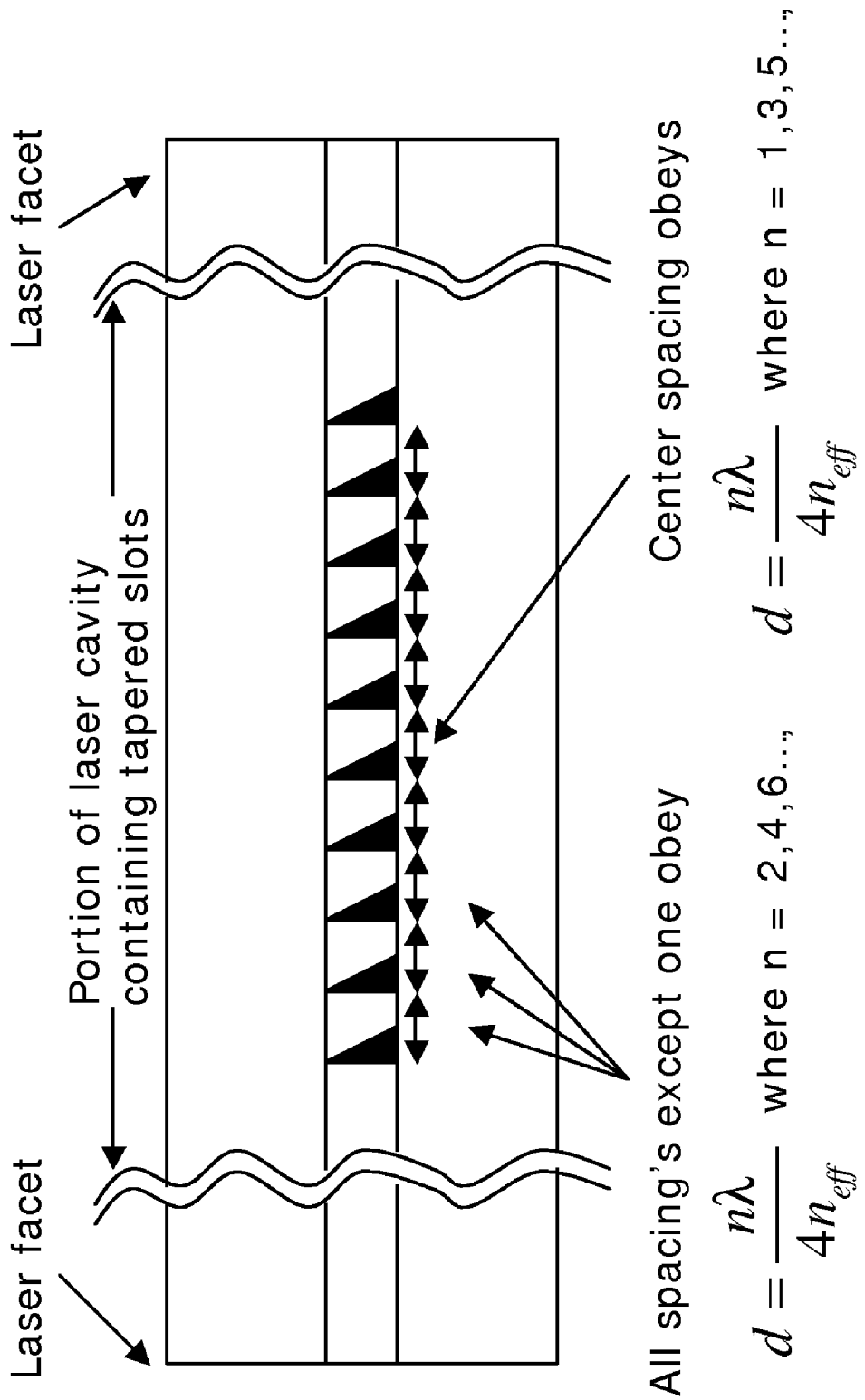

where n=2, 4, 6 . . . ;

FIG. 11 shows a calculated cavity loss spectrum for an uncoated device containing twenty angled slot features;

FIG. 12 shows a calculated cavity loss spectrum for an uncoated device containing twenty angled slot features;

FIG. 13 shows the effect on the cavity loss spectrum when the effect of both scattering and reflection are considered;

FIG. 14 shows two tapered slots in the laser cavity;

FIG. 15 illustrates the cavity loss of the mode represented by the standing wave is substantially increased by the presence of the tapered slots;

FIG. 16 represents a cavity containing a tapered slot filled with metal;

FIG. 17 shows that the cavity loss at the wavelength λ will be lowest in a situation where the abrupt interface of a angled slot coincide with a node of the electric field;

FIG. 18 shows a calculated cavity loss spectrum for an uncoated device containing twenty angled slot features filled with metal;

FIGS. 19 & 20 illustrate a quarter material wavelength step;

FIG. 21 illustrates the slot spacing in a device where the processes of scattering and reflection are counteracting each other, and FIG. 22 illustrates one arrangement of angled slot features which eliminates the affects reflections cavity loss spectra in the wavelength region of interest.

DETAILED DESCRIPTION

Figure 1:
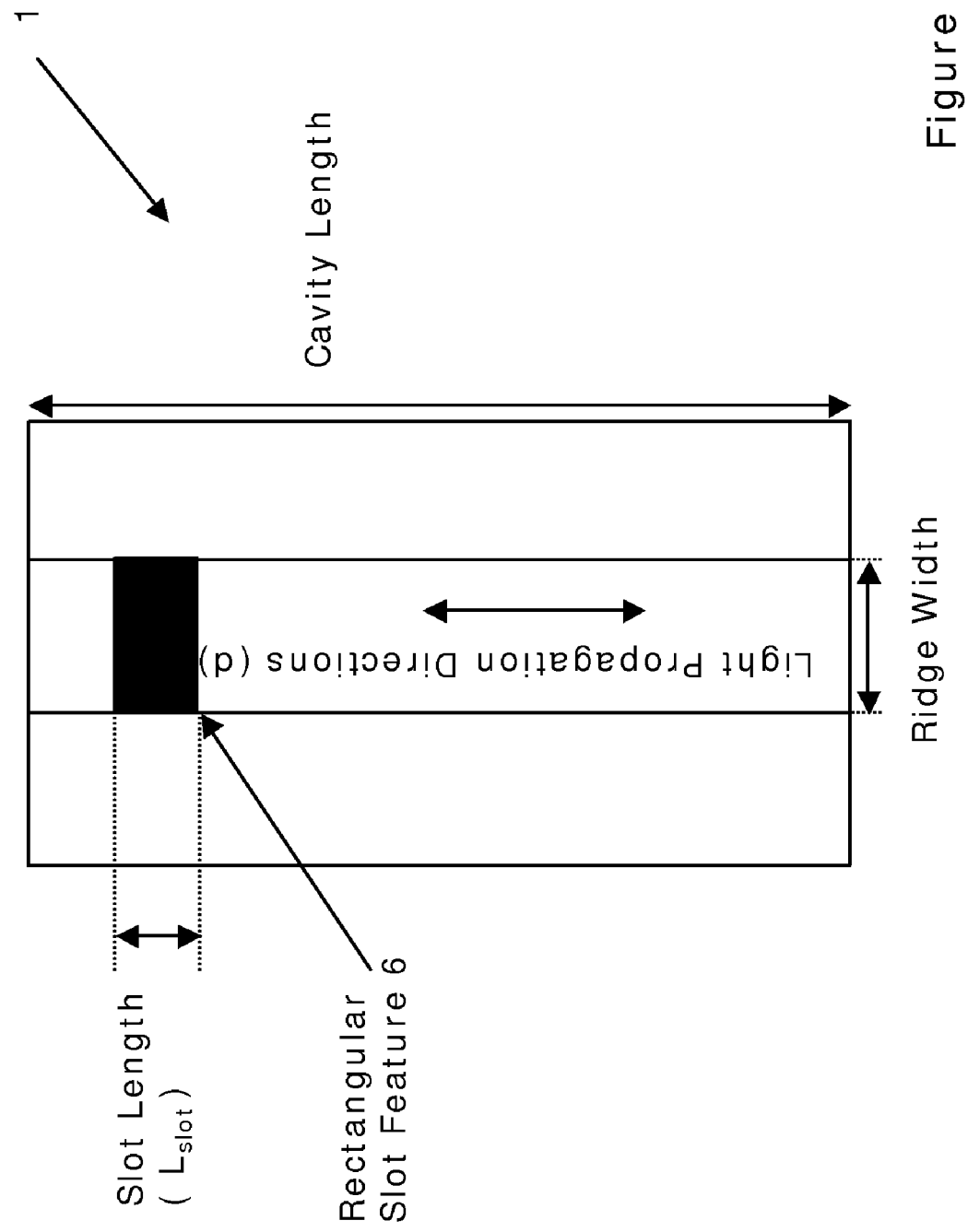
FIGS. 1 and 2 illustrate a typical prior art slotted laser having a single rectangular slot.
Figure 2:
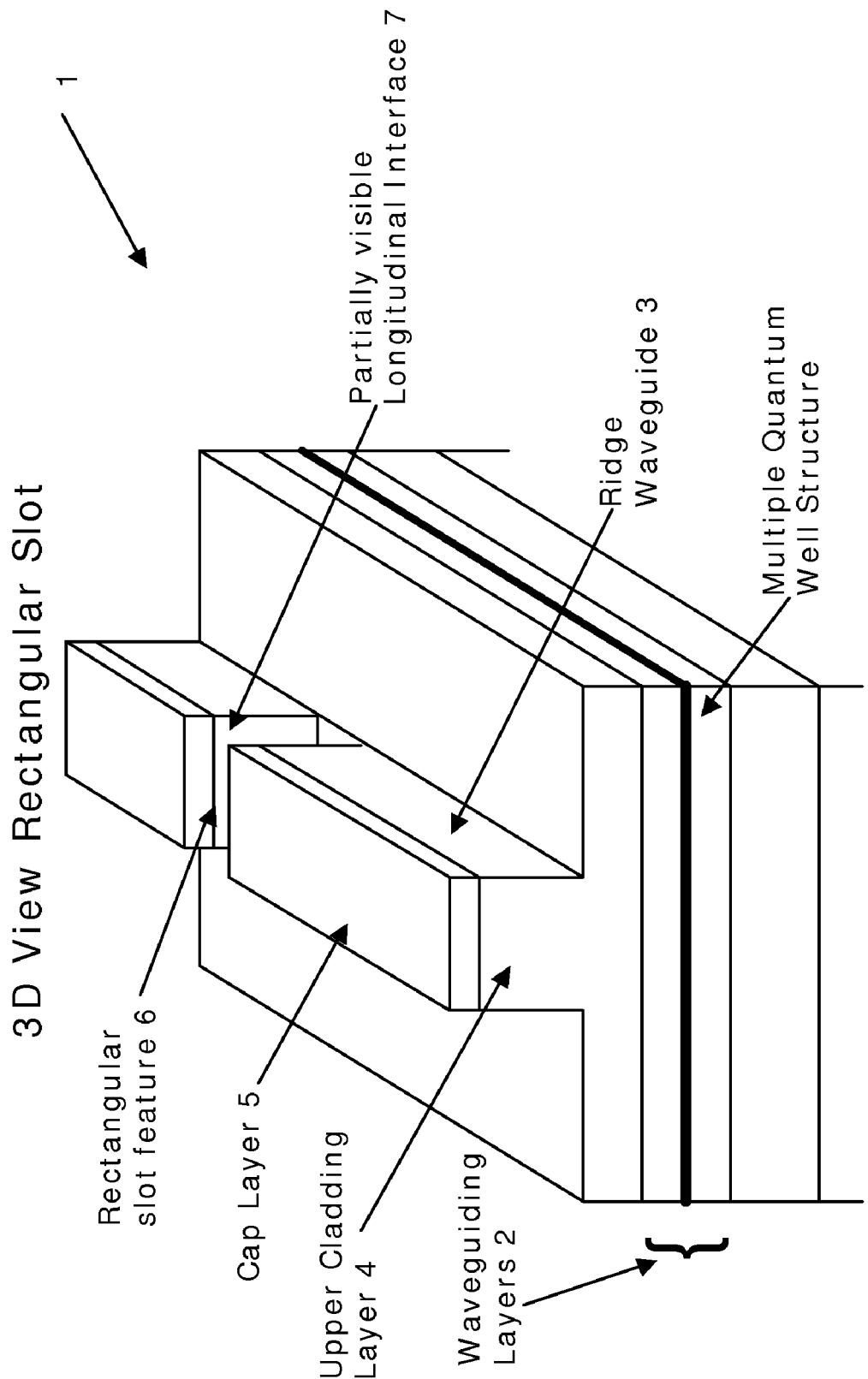
Figure 3:
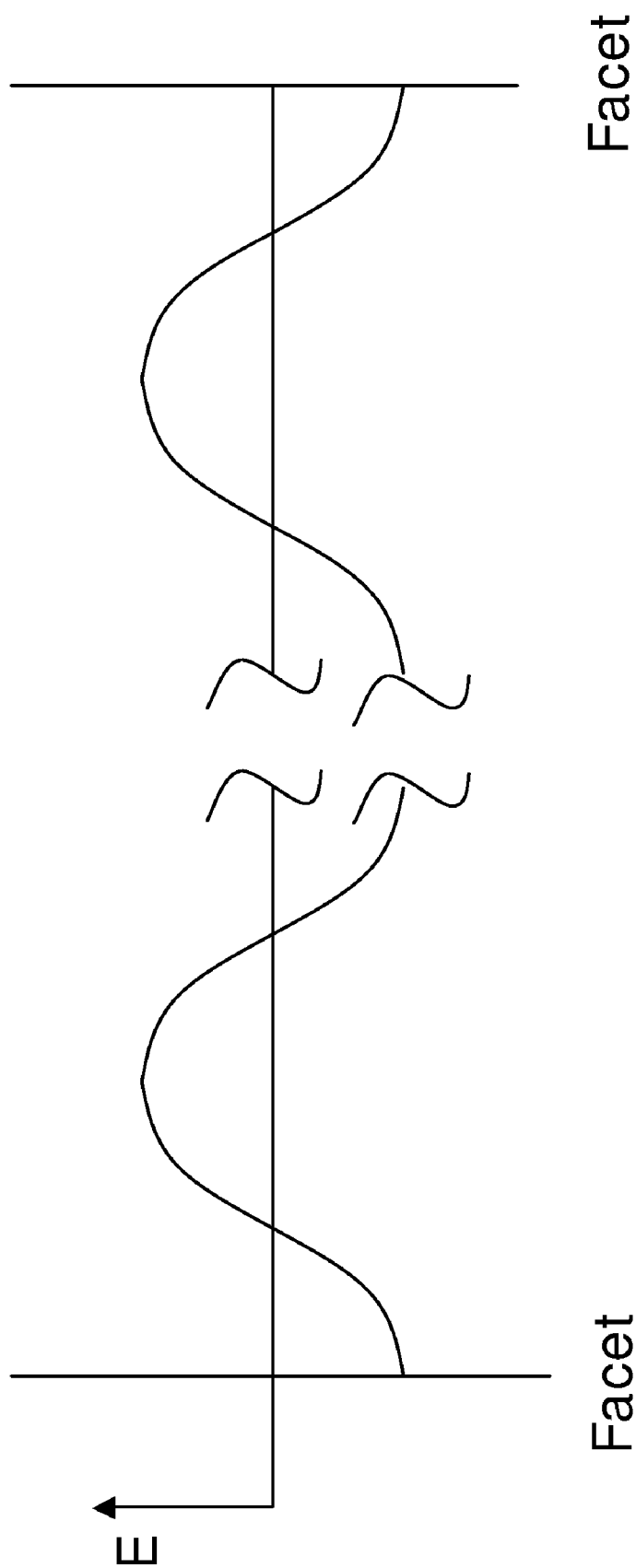
FIG. 3 illustrates an exemplary standing wave in an uncoated Fabry Perot laser diode.

FIG. 3 shows a standing wave pattern in an uncoated Fabry Perot laser diode which does not comprise any slot features. As the real part of the refractive index of the semiconductor material is greater than that of the air surrounding the cavity there is no phase shift associated with the process of reflection at the facets. A consequence of this is that constructive interference between light incident on the facet and reflected light occurs when there is an anti-node in the electric field at the facet. This in turn means that the standing wave pattern in the cavity has an anti-node at each facet.

Figure 4:
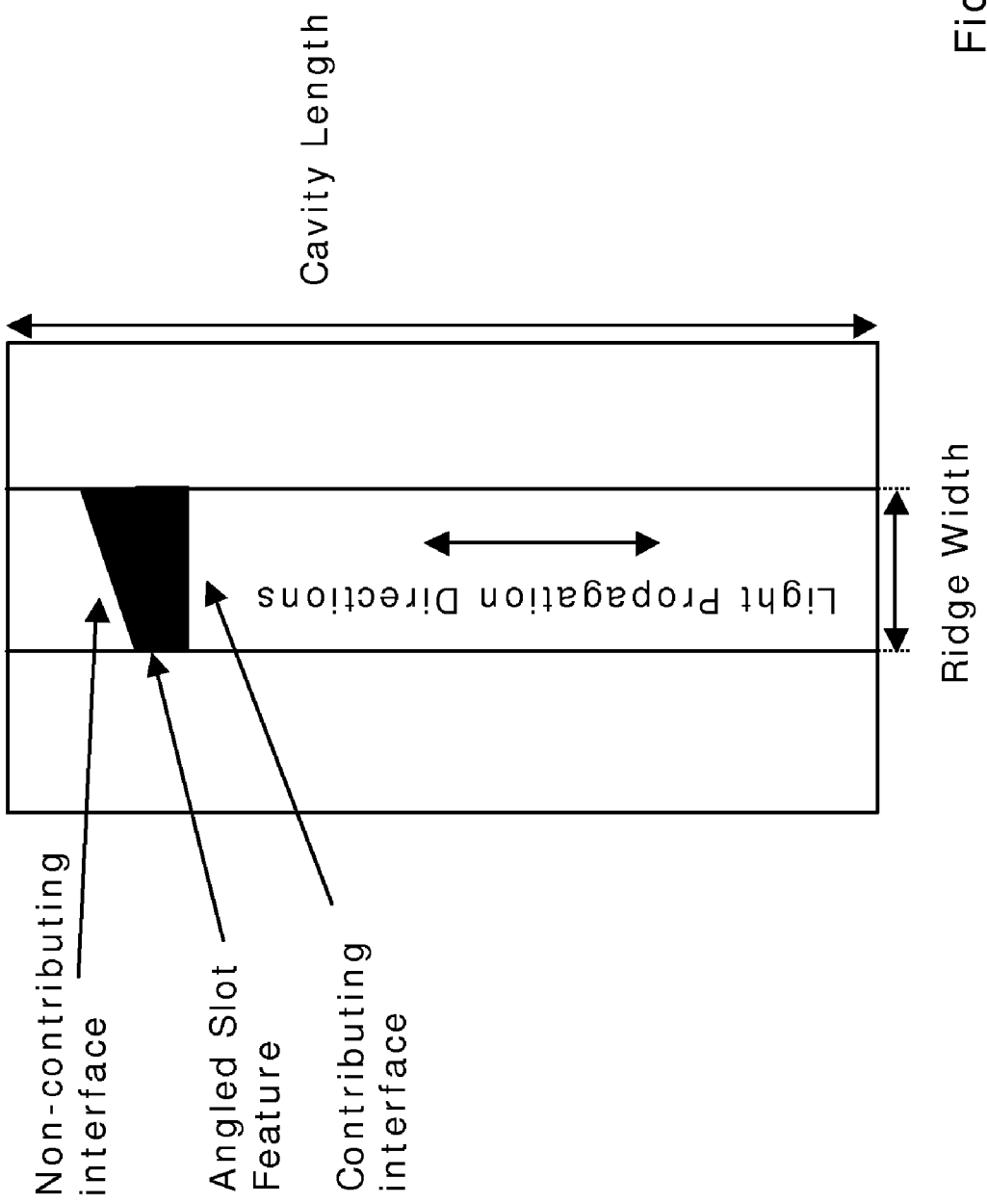
FIGS. 4 and 5 show a laser diode containing a single angled slot feature.
Figure 5:
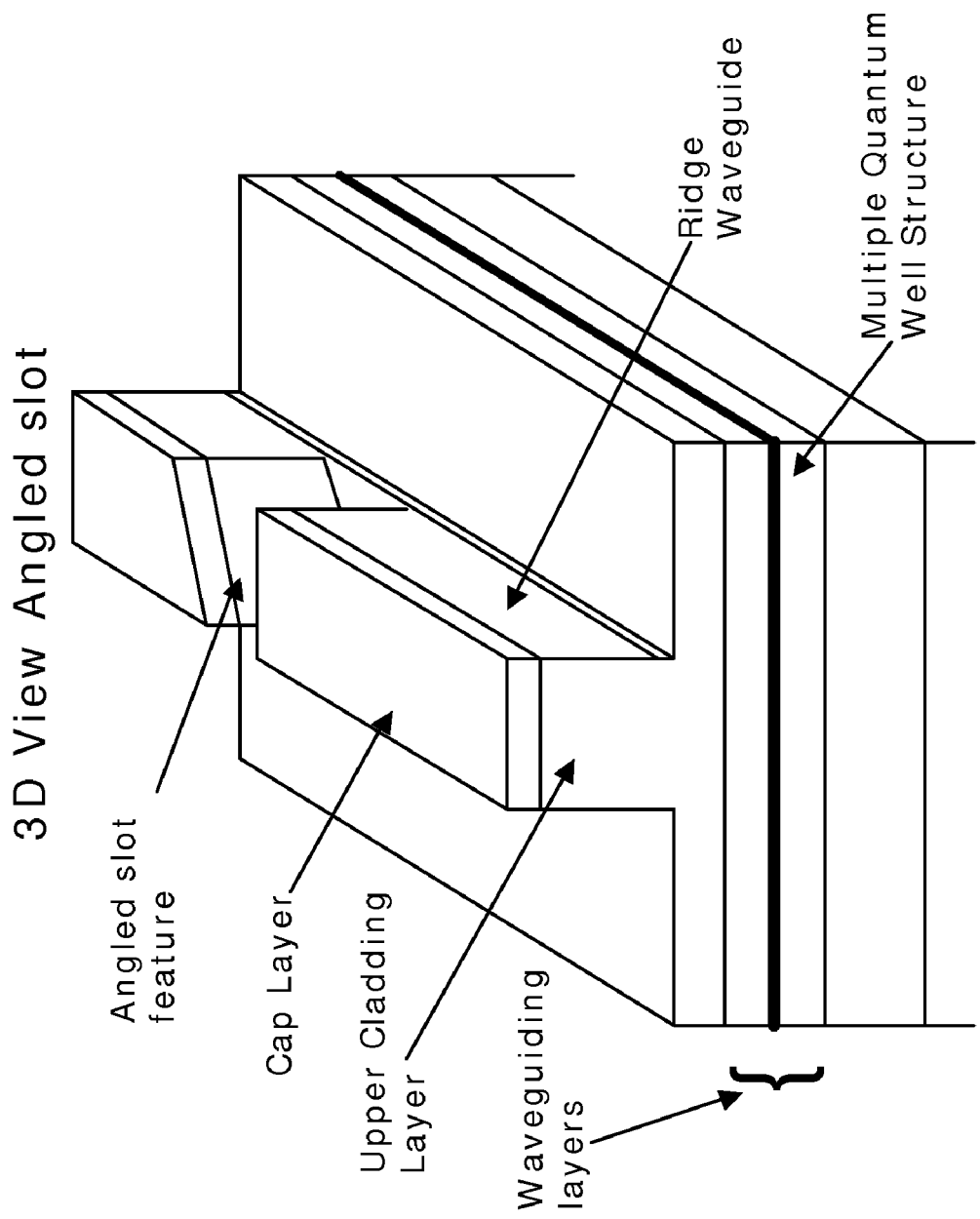

FIGS. 4 and 5 show a laser diode containing a single angled slot feature (as described in Irish Patent No. S83622), in which the cavity is filled with $SiO_2$. It is noted that one of the interfaces which defines these features is perpendicular to the direction of light propagation, while the other interface is angled with respect to this direction. In a device containing a number of these features it is the perpendicular or "abrupt" interfaces which affect the cavity losses of the various longitudinal modes. The graded interface does not significantly alter the shape of the cavity loss spectrum of the device. As the refractive index of $SiO_2$ is 1.5, the transverse mode beneath the slot feature is altered, this has the effect of lowering the effective index of the guided mode in this region.

However, it should be noted that the effective index method underestimates the reflectivity of such features. In order to properly calculate the reflectivity of these features a more appropriate method such as the Finite Difference Time Domain may be employed. For example, for a laser diode having the layer structure in Table 1, with a slot feature etched to a depth 1.54 microns, the effective index method underestimates the reflectivity from the slot features by a factor of 25.

TABLE 1

A exemplary layer structure for a laser diode.

| Layer No. | Material | Thickness (microns) | Refracfive index | Comment |
| --- | --- | --- | --- | --- |
| 6 | InGaAs | 0.200 | 3.5 | Cap |
| 5 | InP | 1.600 | 3.205 | Cladding |
| 4 | $Al_{0.48}In_{0.52}As$ | 0.120 | 3.23 | Cladding |
| 3 | AlInGaAs | 0.140 | 3.4 (ave) | QW & barriers |
| 2 | $Al_{0.48}In_{0.52}As$ | 0.100 | 3.23 | Cladding |
| 1 | InP | 100.0 | 3.205 | Substrate |

Figure 6:
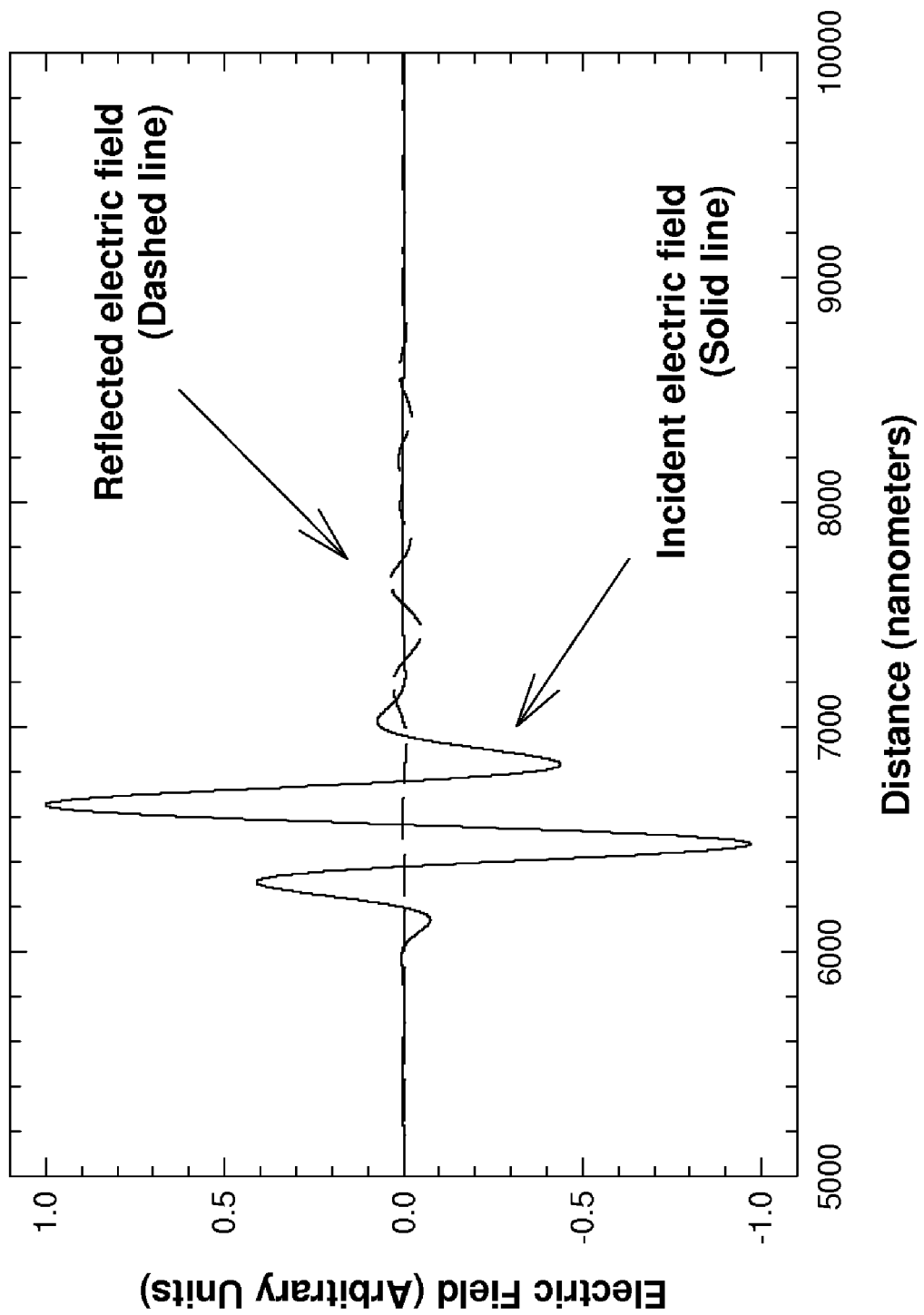
FIG. 6 illustrates incident and reflected electric fields in a laser of the type shown in FIGS. 4 and 5.
Figure 7:
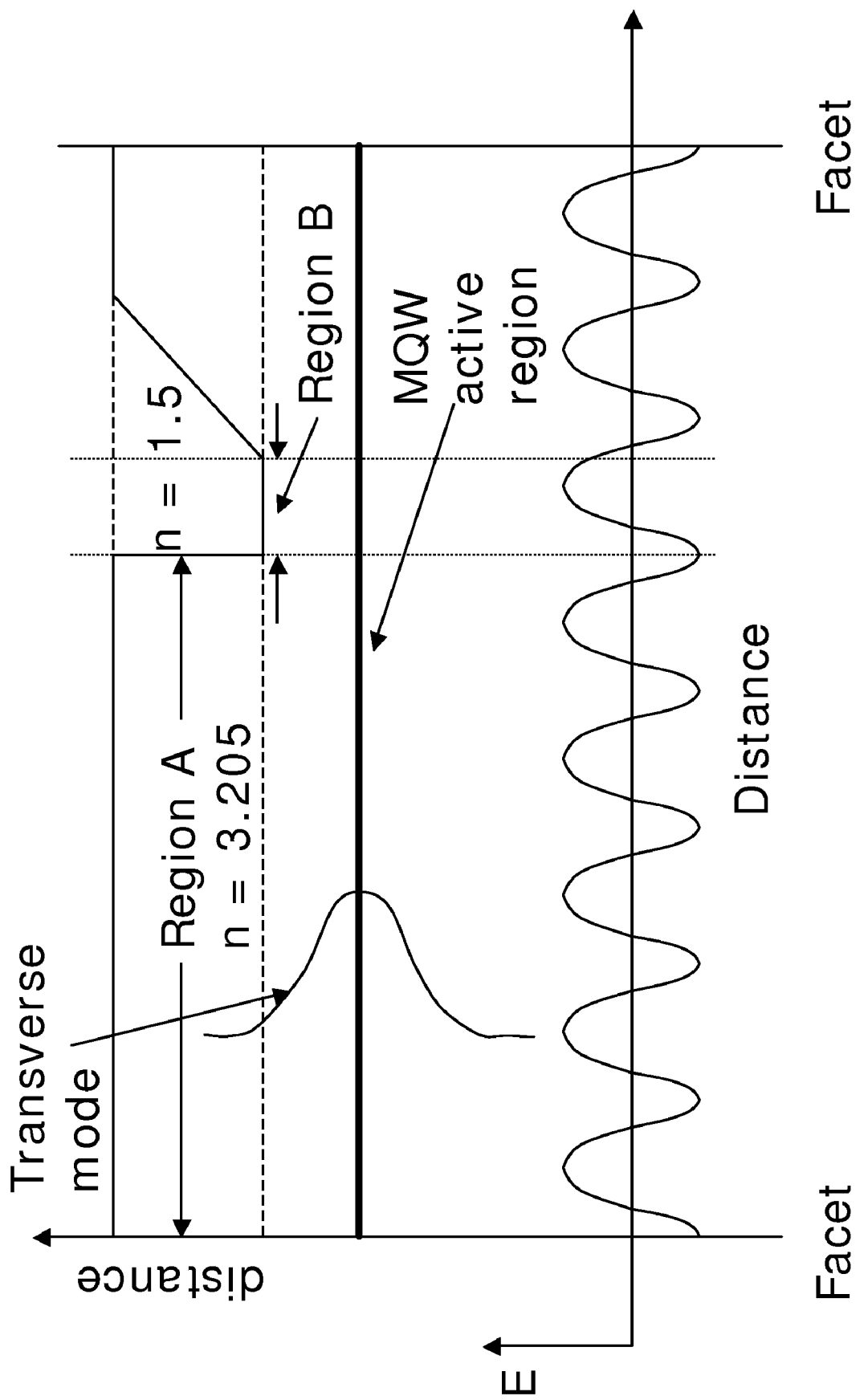
FIG. 7 illustrates a calculated electric field pattern travelling from a first region "region A" to a second region "region B"

FIG. 6 shows a calculated electric field pattern travelling from "region A" to "region B" (FIG. 7), and the calculated electric field pattern reflected back into "region A". The peak amplitude of the incident electric field is normalised to unity, whereas the peak amplitude of the reflected electric field is 0.04. Using the effective index method the peak value of the electric field reflected back into "region A" is 0.0016 which is a gross underestimate of the true value.

Figure 8:
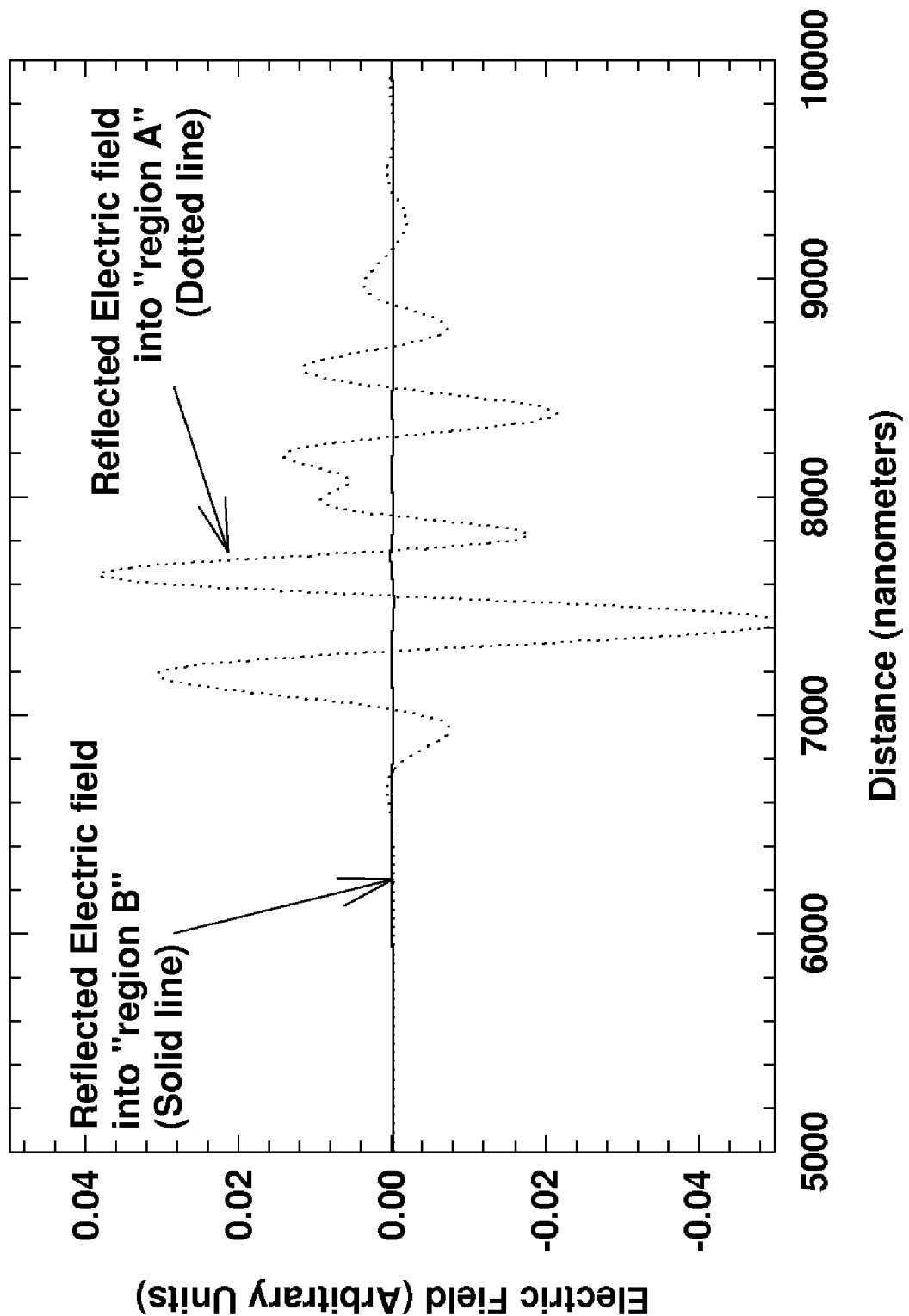
FIG. 8 shows reflected electric field patterns which result from an electric field patterns travelling from "region A" into "region B" and also from "region B" into "region A" of FIG. 7.
Figure 9:
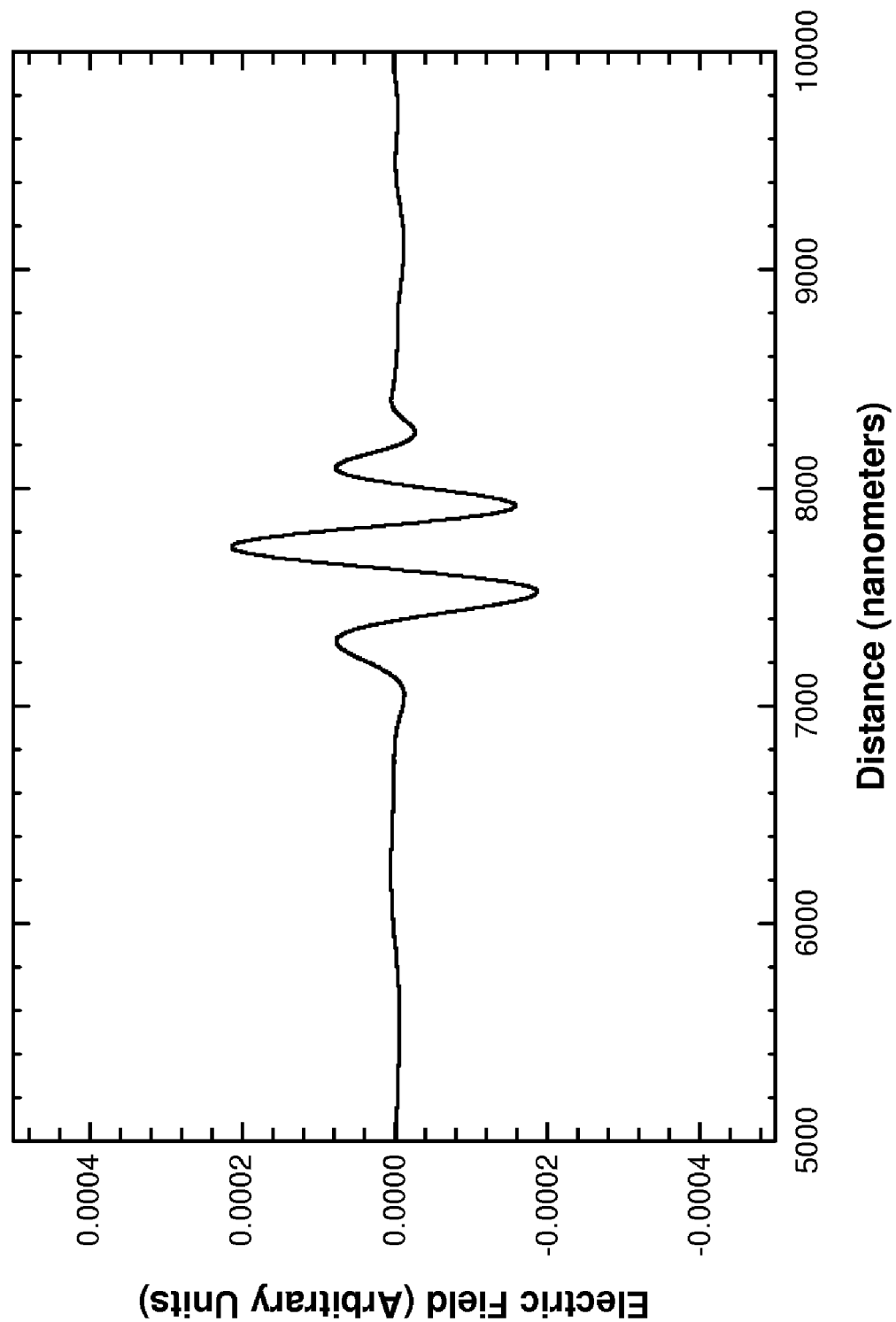
FIG. 9 shows the reflected pattern.

The placement of slot features in the laser cavity is also considered. At the abrupt interface, light of a given mode reflected from this interface interferes constructively with itself when the interface is positioned at an anti-node in the electric field. This is because the standing wave may be decomposed into two travelling waves. Furthermore it may be shown using the Finite Difference Time Domain method that a wave travelling from "region A" to "region B" is reflected to a greater extent than a wave travelling from "region B" to "region A". FIG. 8 shows reflected electric field patterns which result from an electric field patterns travelling from "region A" into "region B" and also from "region B" into "region A". The amplitude of the electric field pattern reflected back into "region A" has as we saw in FIG. 8 an amplitude of 0.05. The amplitude of the field reflected into "region B" by comparison has an amplitude of only 0.00021, a factor of 190 times smaller than the field reflected in the opposite direction. For the purposes of clarity, this pulse is shown plotted separately in FIG. 9. Therefore we need only consider reflections propagating back into "region A".

Figure 10:
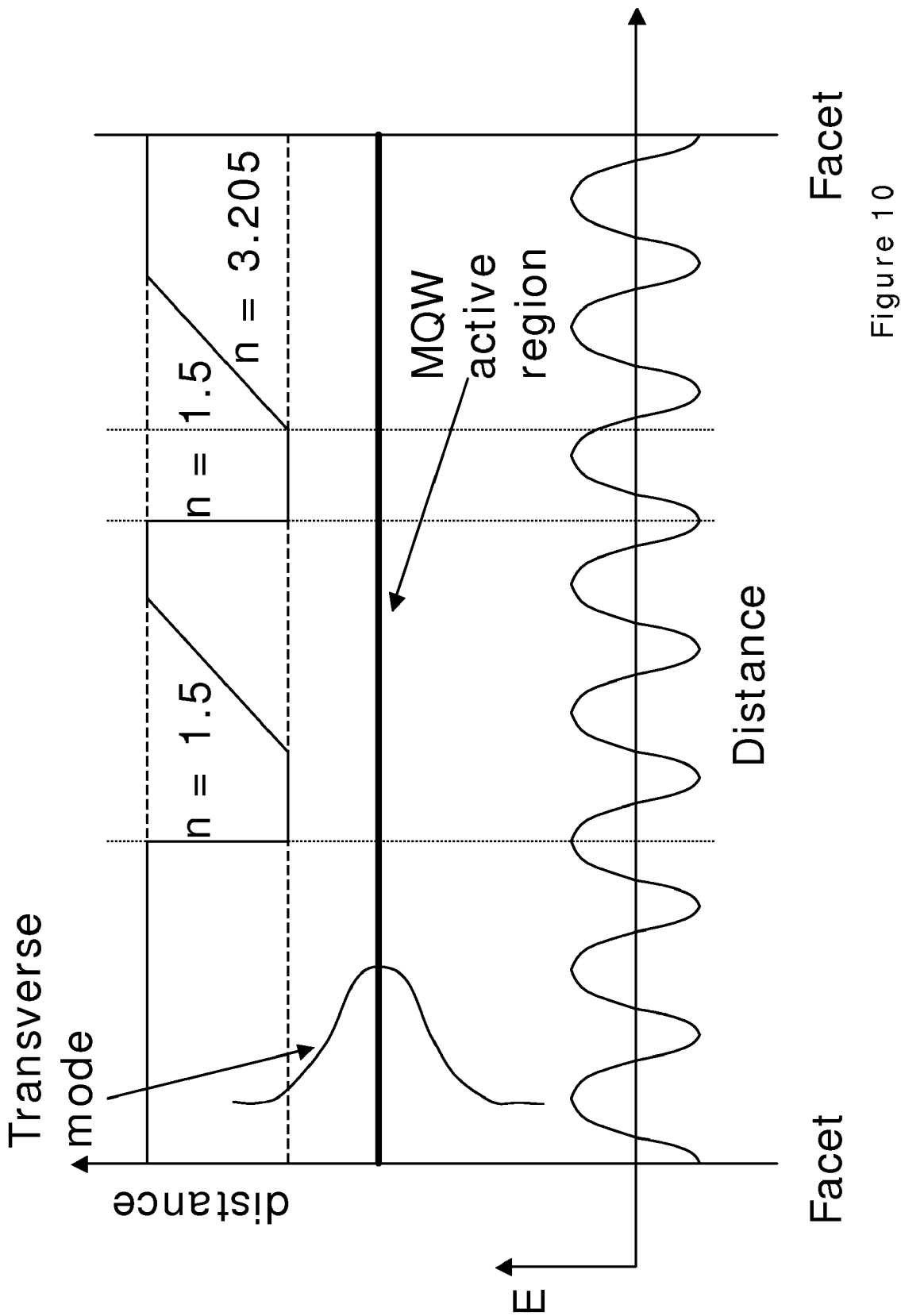
FIG. 10 is the field for a device containing one or more etched slot features, positioned such that the distance between adjacent abrupt interfaces is given by $$d = \frac{n\lambda}{4n_{eff}}$$

For a device containing one or more etched slot features, positioned such that the distance between adjacent abrupt interfaces is given by, $$d = \frac{n\lambda}{4n_{eff}} \text{ where } n = 2, 4, 6 \ldots ,$$

then the cavity loss of the mode of interest will be lowest in a situation where the abrupt interfaces of the angled slots coincide with an anti-node of the electric field (FIG. 10). A point of note is that the reflections generated at the slot feature have the effect of lowering the cavity losses of the mode or modes of interest, whereas the cavity losses of the other modes are unaffected.

Referring to FIGS. 11 to 13 the effects of reflection and scattering are considered. FIG. 11 shows a calculated cavity loss spectrum for an uncoated device containing twenty angled slot features, taking into account only the reflections which occur at the abrupt interfaces, but not scattering at these interfaces. In the transfer matrix method which is used to calculate the cavity loss spectrum, it is possible to independently calculate the changes in the cavity loss spectrum which result from reflections and the changes which occur due to scattering or absorption. In the absence of the slot features the cavity losses of all modes in the wavelength interval 1230 nm to 1390 nm would be approximately 36.5 $cm^{-1}$. These features were etched into the structure in Table 1, to a depth of 1.15 microns. It will be appreciated that this depth is merely exemplary and that other depths may be selected depending on particular configurations and arrangements.

However as identified above reflectivity is only one of the processes which may alter the shape of a device's cavity loss spectrum. The other processes include, for example, absorption and scattering. Reflections can arise due to longitudinal variations in the complex refractive index profile perpendicular to the propagation direction. Scattering occurs in a ridge waveguide laser when the shape of the complex refractive index profile perpendicular to the direction of light propagation, varies along the length of the device. Absorption occurs when the guided mode interacts with material in the waveguide the imaginary refractive index of which is greater than zero. Both scattering and absorption may affect the shape of the cavity loss profile, provided that they are functions of longitudinal position, one Fourier component of which has a spatial frequency, k, which is greater than $$\frac{2}{\lambda_m}.$$

Where $\lambda_m$ is the wavelength of light in the given material.

Therefore as well as giving rise to reflections, the abrupt interface of an angled slot (of the type discussed above) will introduce scattering losses in the waveguide. This is because the shape of the refractive index profiles in regions "A" and "B" (FIG. 7) are different. Moreover, this scattering site has the potential to affect the cavity loss spectrum of a laser diode device, since it's extent in the longitudinal direction is a small fraction of the optical wavelength.

The exact length of this scattering site is determined by how accurately the interface between regions "A" and "B" may be implemented, and is thus related to the manufacturing tolerances of the manufacturing process.

FIG. 12 shows a calculated cavity loss spectrum for an uncoated device containing twenty angled slot features, taking into account only the scattering which occurs at the abrupt interfaces. These features were again etched into the structure in Table 1, to a depth of 1.15 microns. The effect of these scattering centers is to raise the mirror losses of all but the mode or modes of interest. It may be noted that cavity losses of the majority of the cavity modes are now approximately 43 inverse centimeters, while the cavity loss of the mode of interest remains at approximately 37 inverse centimeters.

The fact that the angled slot acts as both a source of reflection as well as a scattering centre has an unwanted consequence. As was mentioned earlier in order for the reflections from the slot to lower the cavity loss of a given mode, the position of the abrupt interface must coincide with an anti-node of the electric field. However we are now going to show that for the abrupt interface of the slot to act optimally as a scattering center, the abrupt interface should substantially coincide with a node in the electric field.

FIG. 13 shows the effect on the cavity loss spectrum when the effects of both scattering and reflection are considered, for a slot feature filled with a dielectric. We see that in this case the changes in the cavity loss spectrum due to the processes of scattering and reflection tend to cancel each other out. Thus the difference between the cavity loss of the mode of interest and the modes which must be discriminated against is reduced.

Referring to FIG. 14 a laser cavity having two tapered slots is shown. The abrupt interfaces of both slots coincide with nodes in the electric field. The cavity losses of the mode represented by this standing wave are almost unaffected by the slot features since the electric field is zero at the waveguide discontinuities. The cavity loss of the mode represented by the standing wave in FIG. 15 however is substantially increased by the presence of the tapered slots. This is because the electric field at the discontinuities is no longer equal to zero, as a result light is scattered out mode.

On first inspection it appears that we have reached an impasse, in that the effect of reflections on the cavity loss spectrum is optimised when the abrupt interfaces coincide with the anti-nodes in the electric field, while the effect of scattering on the cavity loss spectrum is optimised when the abrupt interfaces coincide with nodes in the electric field. Thus the scattering and reflection processes tend to counteract each other's effect on the cavity loss spectrum.

Referring to FIG. 16, a laser cavity 100 comprises a tapered slot 101. The tapered slot 101, is in this case, filled with metal.

The slot 101 may alternatively be filled with a combination of metal and a dielectric layer, for example, $SiO_2$. The dielectric layer is provided between the slot edge and the reflective material. In which case the $SiO_2$ layer, which is deposited first must be very thin less than approximately 60 nm.

The metal used to fill the slot 101 has a large imaginary index, and is highly reflective at the wavelength of interest.

As before it may be shown using the Finite Difference Time Domain (FDTD) method that a wave travelling from "region A" to "region B" is reflected to a greater extent than a wave travelling from "region B" to "region A". Therefore we need only consider reflections propagating back into "region A".

Filling the slot with metal however fundamentally alters the reflection properties of the abrupt interface. This is because now the light undergoes a phase shift during the process of reflection from a semiconductor metal interface. Now at the abrupt interface, light of a given mode reflected from this interface interferes constructively with itself when the interface is positioned at a node in the electric field. This is also the correct place to position the slot in order to optimally alter the cavity loss spectrum using scattering centers. In this arrangement the processes of reflection and scattering are working together to change the shape of the cavity loss spectrum. For a device containing more than one etched slot features filled with metal, positioned such that the distance between adjacent abrupt interfaces is given by, $$d = \frac{n\lambda}{4n_{eff}} \text{ where } n = 2, 4, 6 \ldots ,$$

then the cavity loss at the wavelength $\lambda$ is lowest in a situation where the abrupt interface of an angled slot coincides with a node of the electric field (FIG. 17).

FIG. 18 shows a calculated cavity loss spectrum for an uncoated device containing twenty angled slot features, filled with metal taking into account the effects of both scattering and reflections within the cavity due to the abrupt interfaces. This Figure demonstrates that the processes of scattering and reflectivity work together to alter the cavity loss spectrum.

It is noted that the above arguments apply equally well to devices containing square slot features as to those containing rectangular slot features, so long as the separation between interfaces in a given slot is in accordance with the following condition $$L_{slot} = \frac{n\lambda}{4n_{eff}} \text{ where } n = 1, 3, 5 \ldots ,$$

In the case of a laser diode having slot features comprising a filling of a dielectric material such as $SiO_2$ only, the shape of the abrupt slot interface may be changed in order to eliminate reflections. In this case it is the scattering process alone that will alter the shape of the cavity loss spectrum. This is achieved by introducing a quarter material wavelength step substantially in the center of the abrupt interface (FIGS. 19 & 20). In this case the abrupt interface comprises two sections spaced longitudinally from one another along the laser cavity, so that substantially a quarter wavelength step is provided at the interface where the two sections are located to either side of the central axis of the laser. This configuration results in the reflected light from the two portions of the abrupt interface being phase shifted by 90 degrees with respect to each other, as such they destructively interfere with one another. While the two portions of the abrupt interface now induce loss in the mode or modes of interest as well as the other modes, it is still localised enough to alter the shape of the mirror loss profile.

Another way of improving the operation of lasers with slot features containing only $SiO_2$ is by careful positioning of the slots with respect to one another.

This method also substantially eliminates the effect which reflections have on the cavity loss spectra. FIG. 21 illustrates the slot spacing in a device where the processes of scattering and reflection are counteracting each other. FIG. 22 illustrates one possible arrangement of angled slot features which substantially eliminate the affects reflections cavity loss spectra in the wavelength region of interest. In both FIGS. 21 and 22 all the slot features are assumed to be on the right hand side of the center point in the cavity. There are of course many other configurations of angled slot features which achieve the same effect and are thus come within the scope of this invention.

The present application provides an improved understanding of how of the spectrum of a ridge waveguide laser diode may be modified by the presence of etched slot features in the ridge waveguide, due to the processes of scattering and reflection and teaches how to utilise combined these processes simultaneously to achieve a performance increase to the cavity loss spectrum. A number of structures are described which take advantage of this new understanding. It will be appreciated by those skilled in the art that the description and examples which follow are included for the purposes of explanation and that the scope of protection for the application is not to be construed as being limited by the examples.

It will be appreciated by those skilled in the art that the structures and slot configurations described herein may be readily implemented using techniques common in the field of semiconductor manufacture generally and more particularly in the field of semiconductor laser manufacture.

The invention claimed is:

1. A laser comprising a laser cavity, the laser further comprising one or more slots, wherein at least one slot has two interfaces, characterised in that the at least one slot is substantially filled with a reflective material having a large imaginary index relative to the laser cavity material and one of the two interfaces comprises two sections on a single side of the at least one slot spaced longitudinally from one another along the laser cavity, so that substantially a quarter wavelength step is provided at the one of the two interfaces.

2. A laser according to claim 1, wherein the reflective material is a metal.

3. A laser according to claim 1, where the at least one slot is a tapered slot.

4. A laser according to claim 3, wherein the at least one slot comprises a gradual interface and an abrupt interface.

5. A laser according to claim 4, wherein a plurality of slots are provided and the distance between the abrupt interfaces is given by $$d = \frac{n\lambda}{4n_{eff}}$$

where $\lambda$ is the operating wavelength of the laser, and $n_{eff}$ is the effective reflective index of the cavity and n is a positive even number.

6. A laser according to claim 1, where a thin layer of dielectric Silicon dioxide is provided between the at least one slot edge and the reflective material.

7. A laser according to claim 1, where the at least one slot is a rectangular slot.

8. A laser according to claim 7, wherein a plurality of slots are provided and the distance between the interfaces is given by $$L_{slot} = \frac{n\lambda}{4n_{eff}}$$

where $\lambda$ is the operating wavelength of the laser, and $n_{eff}$ is the effective reflective index of the cavity and n is a positive even number.

9. A laser according to claim 1 wherein the laser is a ridge laser.

10. A laser comprising a laser cavity, the laser further comprising one or more slots, wherein at least one slot has two interfaces, wherein one of the two interfaces is an abrupt interface, characterised in that the abrupt interface comprises two sections on a single side of the at least one slot spaced longitudinally from one another along the laser cavity, so that substantially a quarter wavelength step is provided at the abrupt interface.

11. A laser according to claim 10, wherein the two sections are located to either side of the central axis of the laser.

12. A laser according to claim 10 wherein the laser is a ridge laser.

13. A method of manufacturing a laser comprising the steps of:
   providing a laser cavity;
   defining one or more slots at a place along said laser cavity, wherein at least one slot has two interfaces, characterised in that one of the two interfaces comprises two sections on a single side of the at least one slot spaced longitudinally from one another along the laser cavity, so that substantially a quarter wavelength step is provided at the one of the two interfaces; and
   substantially filling said at least one slot with a reflective material having a large imaginary index relative to the laser cavity material.

14. A method according to claim 13, wherein the reflective material is a metal.

15. A method according to claim 13, where the at least one slot is a tapered slot.

16. A method according to claim 15, wherein the at least one slot comprises a gradual interface and an abrupt interface.

17. A method according to claim 16, wherein the method comprises providing a plurality of slots and where the distance between neighbouring abrupt interfaces is given by $$d = \frac{n\lambda}{4n_{eff}}$$

where $\lambda$ is the operating wavelength of the laser, and $n_{eff}$ is the effective reflective index of the cavity and n is a positive even number.

18. A method according to claim 13, further comprising the step of providing a thin layer of dielectric Silicon dioxide between the at least one slot edge and the reflective material.

19. A method according to claim 13, where the at least one slot is a rectangular slot.

20. A method according to claim 19, wherein a plurality of slots are provided and the distance between the interfaces is given by $$L_{slot} = \frac{n\lambda}{4n_{eff}}$$

where $\lambda$ is the operating wavelength of the laser, and $n_{eff}$ is the effective reflective index of the cavity and n is a positive even number.

* * * * *